United States Patent
Sundar et al.

(10) Patent No.: US 8,599,531 B2
(45) Date of Patent: Dec. 3, 2013

(54) ELECTROSTATIC END EFFECTOR APPARATUS, SYSTEMS AND METHODS

(75) Inventors: Satish Sundar, Bangalore (IN); Jeffrey C. Hudgens, San Francisco, CA (US); Prudhvi R. Chintalapati, Milpitas, CA (US); William Nixon Taylor, Jr., Dublin, CA (US); William P. Laceky, Georgetown, TX (US); Jeffrey A. Brodine, Los Gatos, CA (US); Dean C. Hruzek, Austin, TX (US); Mario Dave Silvetti, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1001 days.

(21) Appl. No.: 12/684,733

(22) Filed: Jan. 8, 2010

(65) Prior Publication Data

US 2010/0178139 A1 Jul. 15, 2010

Related U.S. Application Data

(60) Provisional application No. 61/143,807, filed on Jan. 11, 2009.

(51) Int. Cl.
*H01L 21/683* (2006.01)
*H01L 21/67* (2006.01)
*H01L 21/673* (2006.01)
*H01L 21/677* (2006.01)

(52) U.S. Cl.
CPC ......... *H01L 21/6833* (2013.01); *H01L 21/6831* (2013.01); *H01L 21/683* (2013.01); *H01L 21/67* (2013.01); *H01L 21/673* (2013.01); *H01L 21/677* (2013.01); *Y10S 414/141* (2013.01); *Y10S 901/30* (2013.01); *Y10S 901/40* (2013.01)
USPC ................. 361/234; 414/222.01; 414/225.01; 414/800; 414/806; 414/941; 294/86.4; 294/213; 901/30; 901/40

(58) Field of Classification Search
CPC ......... B23Q 3/15; B25J 15/06; H01L 21/677; H01L 21/67742; H01L 21/683; H01L 21/6831; H01L 21/6833; H01L 21/68707; H02N 13/00
USPC ........... 294/103.1, 213; 361/234; 414/222.01, 414/225.01, 744.5, 800, 806, 941; 901/30, 901/31, 40
See application file for complete search history.

(56) References Cited

U.S. PATENT DOCUMENTS 6,817,640 B2    11/2004    Menon et al.
6,876,534 B2 *    4/2005    Tossell ........................ 361/234

(Continued)

FOREIGN PATENT DOCUMENTS

CN    1653211 A    8/2005
CN    1902031 A    1/2007

(Continued)

OTHER PUBLICATIONS

Prudhvi R. Chintalapati et al., U.S. Appl. No. 12/684,754, filed Jan. 8, 2010.

(Continued)

*Primary Examiner* — Saul Rodriguez
*Assistant Examiner* — Brendan Tighe
(74) *Attorney, Agent, or Firm* — Dugan & Dugan, PC

(57) ABSTRACT

Systems, apparatus and methods for transporting substrates between system components of an electronic device manufacturing system are provided. The systems and apparatus include an electrostatic end effector having a base, an electrode pair on the base, and spacer members for spacing the substrate from the electrode pairs to provide a gap between the electrode pair and the substrate. Methods of the invention as well as numerous other aspects are provided.

25 Claims, 7 Drawing Sheets

(56) References Cited

U.S. PATENT DOCUMENTS

| | | | |
|---|---|---|---|
| 7,623,334 B2 * | 11/2009 | Mizuno et al. | 361/234 |
| 2010/0104403 A1 * | 4/2010 | Cho et al. | 414/222.13 |

FOREIGN PATENT DOCUMENTS

| | | | | |
|---|---|---|---|---|
| JP | 10-092917 | | 4/1998 | |
| JP | 11-168132 | | 6/1999 | |
| KR | 10-2001-0026858 | | 4/2001 | |
| KR | 10-2006-0074581 | | 7/2006 | |
| KR | 10-2008-0083378 | * | 9/2008 | H01L 21/68 |

OTHER PUBLICATIONS

International Search Report and Written Opinion of International Application No. PCT/US2010/020496 mailed Jun. 23, 2010.

International Preliminary Report on Patentability of International Application No. PCT/US2010/020496 mailed Jul. 21, 2011.

Chinese Office Action and Search Report of Chinese Patent Application No. 201080011814.5 dated Mar. 27, 2013.

* cited by examiner

ELECTROSTATIC END EFFECTOR APPARATUS, SYSTEMS AND METHODS

RELATED APPLICATIONS

The present application claims priority to U.S. Provisional Patent Application No. 61/143,807, filed Jan. 11, 2009, and entitled "ELECTROSTATIC END EFFECTOR APPARATUS, SYSTEMS AND METHODS FOR TRANSPORTING SUBSTRATES", which is hereby incorporated herein by reference in its entirety for all purposes.

FIELD OF THE INVENTION

The present invention relates to the manufacture of electronic devices, and more specifically to electrostatic end effector apparatus, systems and methods for transporting substrates.

BACKGROUND OF THE INVENTION

In the manufacture of electronic devices, products, and memory articles, precursor articles to such devices (e.g., substrates) may be transported between various system components of the manufacturing facility by robot apparatus. For example, transport may be from one process chamber to another within a cluster tool, from a load port to a process chamber within a cluster tool, or from a substrate carrier to a load port in a factory interface, etc. During such robotic transport, movement and placement of the substrate with efficiency and precision is desired.

Accordingly, efficient systems, apparatus and methods for transporting substrates in the manufacture of electronic devices are sought after.

SUMMARY OF THE INVENTION

In one aspect a substrate transportation system for transporting a substrate between electronic device manufacturing system components is provided. The substrate transportation system includes a robotic component, and an end effector coupled to the robotic component, the end effector including a base, an electrode pair on the base, and spacer members adapted to form a gap between the substrate and the electrode pair whereby an electrostatic charge is adapted to operate to secure the substrate to the end effector at times during transport between the system components.

According to another aspect, an electrostatic end effector apparatus for transporting a substrate between system components in an electronic device manufacturing system is provided. The electrostatic end effector includes a base adapted to be connected to a robotic component, an electrode pair positioned on the base, and spacer members positioned on the base and adapted to provide a gap between the substrate and the electrode pair.

In another aspect, an electrostatic end effector apparatus for transporting a substrate between system components in an electronic device manufacturing system is provided. The electrostatic end effector includes a nonconductive alumina base adapted to be connected to a robotic component, a conductive electrode pair positioned on the base; spacer members consisting essentially of three domed, conductive contact pads positioned on the base and adapted to space the substrate from the electrode pair by a gap wherein at least one of the spacer members is electrically conductive, and a plurality of touchdown pads positioned on at least one of the base and the electrode pair.

In yet another aspect, a method of transporting a substrate between components of an electronic device manufacturing system is provided. The method includes mounting a substrate on spacer members of an end effector, generating a static charge by applying a voltage to an electrode pair positioned on the end effector to attract the substrate to the spacer members whereby a gap is formed between the substrate and the electrode pair, and transporting the substrate between system components of the manufacturing system while maintaining the static charge at times during the transporting.

Numerous other aspects are provided in accordance with these and other aspects of the invention. Other features and aspects of the present invention will become more fully apparent from the following detailed description, the appended claims and the accompanying drawings.

DETAILED DESCRIPTION

Figure 1:
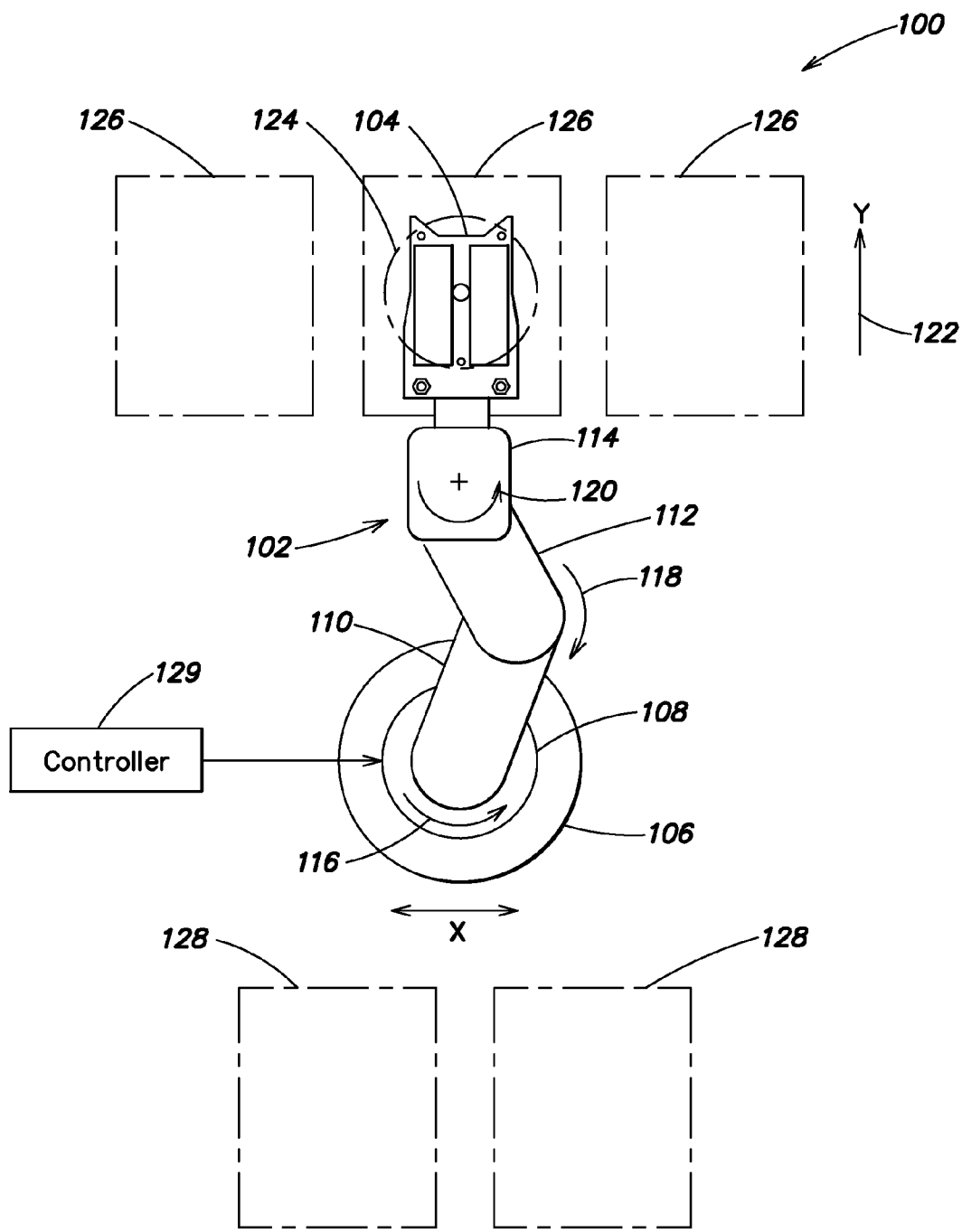
FIG. 1 is a schematic view of a substrate transport system included within an electronic device manufacturing system according to embodiments of the present invention.

Electronic device manufacturing processes use a variety of precursor articles to produce the final device, such as semiconductor wafers, glass plates (all such precursor articles are herein referred to as a "substrate" or "substrates"). During transport of a substrate from one location to another within the manufacturing process and system, the substrate may be carried by an end effector (sometimes referred to as a "blade"). The substrate rests on the end effector during transport and it may be desirable that slippage between the blade and the substrate be reduced or eliminated. Reducing or eliminating such relative sliding motion between the end effector and the substrate may reduce positioning errors, reduce repositioning time when sliding actually occurs, and may further reduce particle generation, which may contaminate the system components and substrates. Moreover, if a suitable clamping force is provided for clamping the substrate to the end effector, then acceleration of the end effector and secured substrate may be increased. This may translate into increased process throughput because the substrate may then be moved between various system components more rapidly, potentially leading to lower electronic device manufacturing costs. In addition, it may also be important that the clamping mechanism be readily operable and releasable.

In accordance with a first aspect of the invention, a substrate transportation system is provided. The substrate transportation system may include a robotic member, such as a robot wrist, robot arm and/or a series of robotic components, and an electrostatic end effector coupled to the robotic member. The electrostatic end effector may generate suitably high clamping forces (sometimes referred to as "chucking forces") such that slippage between the end effector and substrate may be reduced or eliminated during motion. In some instances, clamping forces of greater than 0.2 g may be achieved. The electrostatic end effector may include a base having an electrode pair and spacer members thereon. The base may be nonconductive (e.g., alumina) while the electrode pairs may be generally planar and conductive. The spacer members provide a gap between the electrodes and the substrates. In some embodiments, the spacer members may be comprised of contact pads, which may be domed. In some embodiments, the spacer members may be conductive and may be mounted on the base.

Providing a relative voltage between the electrode pairs forms a static charge, which attracts the substrate and provides a clamping force securing the substrate to the spacer members of the electrostatic end effector. Additionally, in some embodiments, the electrostatic end effector may further include at least one "touchdown pad." As the substrate is deflected under the influence of the static charge, the one or more touchdown pads limit the motion of the substrate such that contact with the electrodes is reduced or eliminated, and flexing or bending of the substrate is minimized.

These and other embodiments of the systems, apparatus and methods are described below with reference to FIGS. 1-11 wherein like numerals are used throughout to denote like elements.

FIG. 1 is a schematic view of an exemplary substrate transport system 100 of the present invention. The system 100 may include a robot 102 and an electrostatic end effector 104 coupled to a robotic component of the robot 102. The robot 102 may be any form of robot, such as a four-link robot, or a Selective Compliance Articulated Robot Arm (SCARA) robot. Other types of robots may be employed. The robot may, for example, include a support base 106 adapted to be mounted to a frame or support (not shown) of a system component. For example, the support base 106 may be mounted to, and supported by, a frame of a cluster tool or frame of a factory interface. In some embodiments, the robot 102 may include a vertical piston 108 which may be moveable relative to the support base 106 along a Z-axis (into and out of the paper). Movement of the vertical piston 108 causes movement of the electrostatic end effector 104 along the Z-axis so as to accomplish a placement of the substrate onto a substrate support, such as by placing the substrate onto pins in a process chamber or onto slots in a substrate carrier. The robot 102 may include any number of robot arms, such as robot arms 110, 112 and robot wrist 114, which may be connected by belts or chains such that a rotation of the first arm 110 in the direction of arrow 116 causes relative rotation of the second arm 112 in a counter direction depicted by arrow 118 and relative rotation of the robot wrist 114 in the direction depicted by arrow 120. These rotations convert into pure translation of an electrostatic end effector 104 along the Y-axis 122.

Such motions may allow the substrate 124 (shown dotted) to be loaded or unloaded from a system component. For example, the substrate transport system 100 comprised of the robot 102 and coupled electrostatic end effector 104 may be adapted to cause the transport of the substrate 124 from a substrate carrier 126 docked at a load port to a load lock 128 of a tool (e.g., a cluster tool) in a factory interface, for example. Optionally, the substrate transport system 100 may be utilized in a transfer chamber of a tool and may transfer a substrate between the load lock 128 and a process chamber (not shown) or between process chambers. The use of the electrostatic end effector may allow relatively fast transport and movement of the substrate 124 without slippage between the electrostatic end effector 104 and the substrate 124. A controller 129 may provide suitable control signals to the robot 102 and also to the electrostatic end effector 104 to control the motion of the robot 102 and attached electrostatic end effector 104 and to further control a static charge generated by the electrostatic end effector 104 by controlling a voltage level supplied to the electrostatic end effector 104. Further details of the exemplary embodiments of electrostatic end effectors are provided below with reference to FIGS. 2-11.

Figure 2:
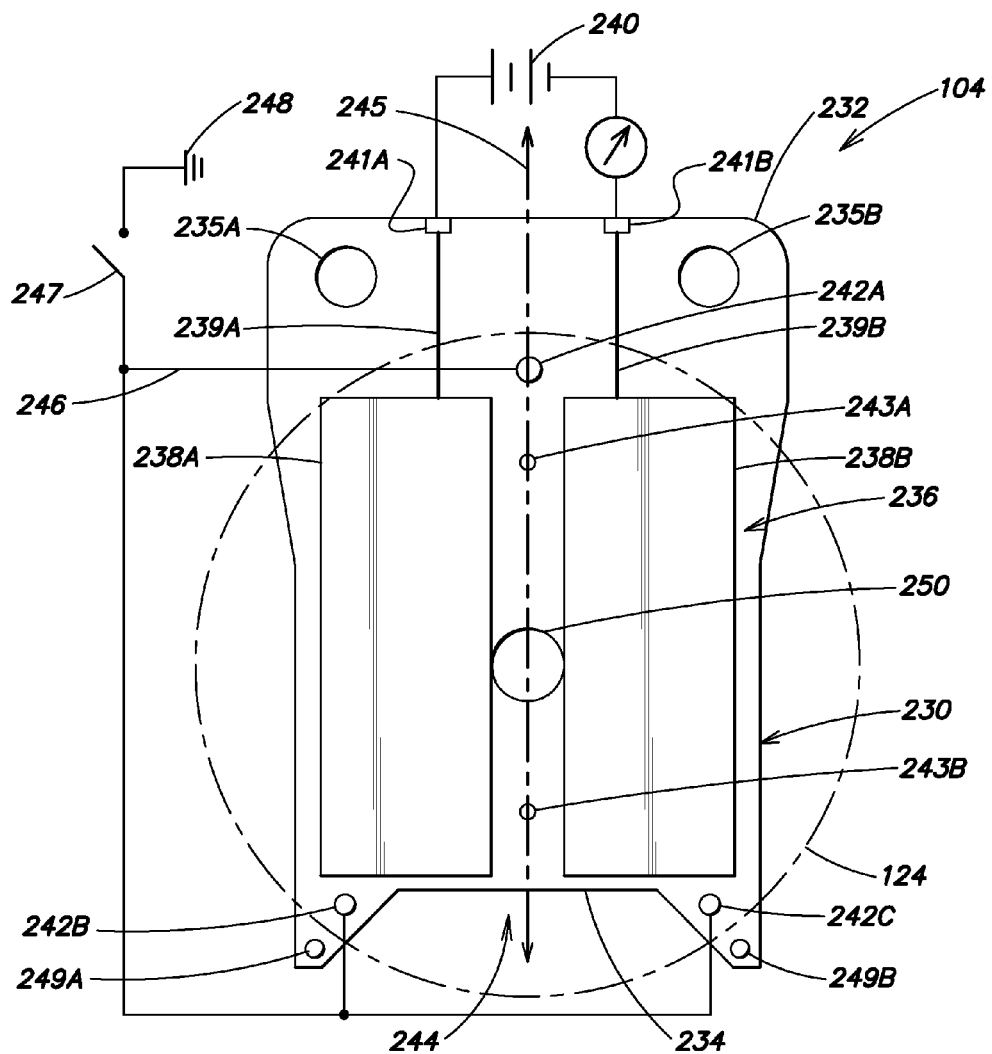
FIG. 2 is a top view of an embodiment of an electrostatic end effector apparatus of the present invention.
Figure 3:
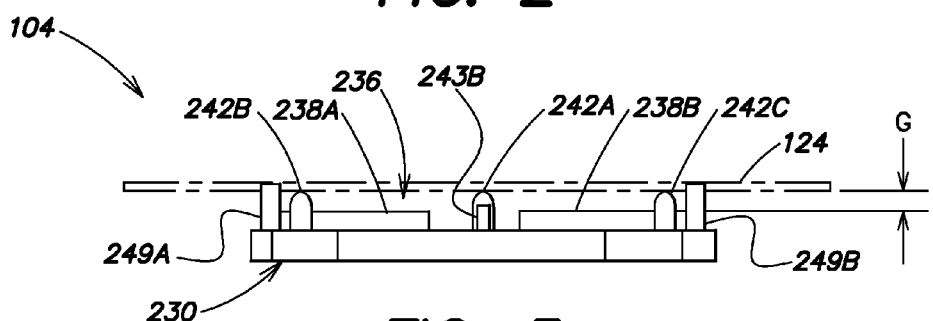
FIG. 3 is a frontal view of the embodiment of electrostatic end effector depicted in FIG. 2.

FIGS. 2 and 3 are schematic top and frontal views, respectively, of an exemplary electrostatic end effector 104 according to an embodiment of the present invention. The electrostatic end effector 104 may include a base 230 including a first end 232 adapted to be attached to a robotic component (not shown), and a second end 234 on an end opposite from the first end 232. The base 230 may be substantially planar, may have a thickness of between about 0.05 inches (1.3 mm) and about 0.12 inches (3.1 mm), and may be manufactured from a suitable nonconductive (insulating) material, for example. One suitable material may be alumina, preferably 99.5% pure aluminum oxide, for example. Other materials and dimensions may be used depending on the size of the substrate and the processing temperatures to which the electrostatic end effector 104 may be exposed. Alumina may provide a good choice because of its ability to withstand relatively high process temperatures (e.g., above 500° C.). The base 230 may be as wide as practical to accommodate passing between the substrate support pins of a process chamber (not shown), for example. The electrostatic end effector 104 may attach to the robotic component (e.g., robot wrist 114 shown in FIG. 1 or a robotic arm) by any suitable means, such as by fasteners (e.g., bolts, screws, rivets, quick disconnect, etc.). For example, when fasteners are used, bolts may be received in holes 235A, 235B, for example. Lesser or more holes may be used.

Provided on the base 230 by either mechanical fastening, recessing, laminating, adhering, or by deposition, etc., may be an electrode pair 236 comprised of a first electrode 238A and a second electrode 238B. The electrodes 238A, 238B may be manufactured from any conductive material and may preferably have a planar upper surface (the surface opposed to the substrate surface). Suitable conductive materials for the electrodes 238A, 238B may include aluminum (e.g., 6061 aluminum), stainless steel, molybdenum (Mb), titanium (Ti), Tungsten (W), Tantalum (Ta), Zirconia ($ZrO_2$), Silicon Carbide (SiC), or silver (Ag), or alloys of the foregoing such as a Mo—Mn alloy. In some embodiments, the he electrodes may be plated, such as with nickel, for example. The electrodes 238A, 238B may be formed as plates or a relatively thin layer of deposited conductive material.

If the electrodes 238A, 238B are deposited as a conductive layer on the base 230, the electrodes may be, for example, a thin layer of a silver (Ag), niobium (Nb), platinum (Pt), tantalum (Ta) or other metal film or deposited layer. Some embodiments may include a silver (Ag) layer of about 10 microns, with a electrolessly or electolytically nickel (Ni) plating to about 125 microns thickness. Optionally, the electrodes 238A, 238B may be a metalized ceramic such as titanium-doped alumina or other doped ceramic with sufficient high conductivity to generate an electrostatic charge. The layer thickness of the deposited layer or film layer may be at least about 5 microns, or at least about 10 microns or more, or at least about 20 microns or more, for example. Other deposited or film layer thicknesses may be used. The electrodes 238A, 238B may have any suitable shape in plan view, such as rectangular or elongated and may be approximately as long as the width of the substrate 124.

The electrodes 238A, 238B may include a dielectric layer formed on a surface thereof to insulate the electrodes from electrical contact. The dielectric layer may be alumina provided by a plasma thermal spray coating operation, for example, and may have a thickness of between about 10 microns and 30 microns or more. However, in some embodiments, the electrodes may be substantially devoid of an insulating dielectric layer. This may increase the ability to quickly release the static charge and thus allow relatively quick clamping and unclamping.

Conductors 239A, 239B may attach to the electrodes 238A, 238B and may be adapted to attach to an adjustable voltage source 240, which is shown schematically. The attachment may be aided by electrical contact patches 241A, 241B, which may allow for ease of connection of the conductors 239A, 239B to wire leads in the robotic members (e.g., wrist and robot arms). Any suitable circuitry or voltage source for providing a variable voltage may be employed. In particular, the voltage may be set to a high level (e.g., 500 V to 2000 V) during transport and reduced to a lower level (or a substantially zero voltage) during a substrate placement operation (whereby separation of the substrate 124 from the end effector 104 may occur). Separation may occur through the use of lift pins or through vertical motion capability of the robot, for example.

The electrostatic end effector 104 further includes spacer members for spacing the substrate 124 a suitable distance from the electrodes 238A, 238B. In some embodiments, the spacer members may be three or more contact pads 242A, 242B, 242C. In another implementation, the number of contact pads may consist essentially of three contact pads only (namely 242A, 242B, and 242C). The contact pads 242A, 242B, 242C may be of any suitable shape (in top view), such as round, oval, square, hexagonal, octagonal or rectangular. Other shapes may be used. Preferably, two contact pads (e.g., 242B and 242C) may be spaced apart in a lateral direction at the second end 234 and may be located on either side of a recess 244 formed in the second end 234 of the base 230. The contact pads 242B and 242C may be spaced as far apart in the lateral direction as practical based upon the size of the substrate 124 being transported and the configuration of the substrate supports in the various process chambers. The contact pad 242A at the first end 232 may be located substantially on a centerline 245 of the electrostatic end effector 104 and located as far toward the first end 232 as practical for the size of the substrate 124. In some embodiments, the contact pads 242A, 242B, 242C may provide a three-point contact with the substrate 124 thereby providing a gap between the substrate 124 and the electrodes 238A, 238B.

The contact pads 242A-242C may be secured to the base 230 by any suitable means, such as welding, press fitting, adhering, screwing, bolting, or other mechanical fastening, etc. One or more, and preferably all, of the contact pads 242A-242C may be electrically conductive. Being electrically conductive may be required to implement electrical grounding, to be described more thoroughly below. Materials for the contact pads 242A-242C may be any of the materials specified for the electrodes listed above. Optionally, the contact pads 242A-242C may be titanium-doped alumina. The contact pads 242A-242C may have a surface roughness (Ra) of between about 45 µm and 65 µm, for example, to improve surface friction and limit particle generation. The contact pads 242A-242C may have a domed profile as best shown in FIG. 3 to further minimize contact area. The contact pads 242A-242C may have a suitable height which raises the substrate 124 above the top surface of the electrodes 238A, 238B by an amount which forms a gap (G) between the substrate and the electrodes 238A, 238B. The height should be designed so that the gap (G) is less than about 0.025 inches (635 microns), or even between about 0.005 and 0.025 inches (about 127 to 635 microns), or even between about 0.010 and 0.020 inches (about 254 to 508 microns).

Shown schematically in FIG. 2 is a switchable ground circuit 246 electrically connected to one or more of the contact pads 242A-242C. The switchable ground circuit 246 may allow any residual static electrical charges to be bled off from the substrate 124 upon turning off the voltage to conductors 239A, 239B. The grounding may be accomplished before a substrate placement wherein the substrate 124 is separated from the electrostatic end effector 104. The ground 248 may be deemed as being switchable because a switch 247 is normally open and the ground 248 inoperative until the voltage to the conductors 239A, 239B has been turned off. Once the voltage has been turned off, then the switch 247 may be closed, interconnecting the ground 248 and draining any residual static charge on the substrate 124. Thus, the switchable feature denotes that the ground 248 may be interconnected via a switch 247, when needed.

In addition to the spacer members, the electrostatic end effector 104 may include one or more touchdown pads 243A, 243B. These touchdown pads 243A, 243B may be positioned in areas where the substrate 124, under the action of the electrostatic force produced by the electrodes 238A, 238B, may be caused to deflect or bow. Thus, the touchdown pads 243A, 243B may minimize or eliminate the possibility of the substrate 124 coming into contact with the electrodes 238A, 238B, which may damage the substrate 124 and/or the electrodes 238A, 238B. As is depicted in the embodiment of FIG. 2, the touchdown pads 243A, 243B may be positioned between the electrodes 238A, 238B and mounted on the base 230. The touchdown pads 243A, 243B should be of suitable height and of suitable number to minimize contact with the substrate 124. In some embodiments, the number of touchdown pads may number 10 or more, 25 or more, or even 50 or more.

The base 230 may include an inspection hole 250 formed therein and located between the electrodes 238A, 238B to allow calibration. Additionally, the base 230 may include stops 249A, 249B, which extend from the base 230 to a height at least above the lower surface of the substrate 124. These stops 249A, 249B may limit any sliding motion of the substrate 124 upon rapid end effector motions after a substrate is placed on the electrostatic end effector 104.

Figure 4:
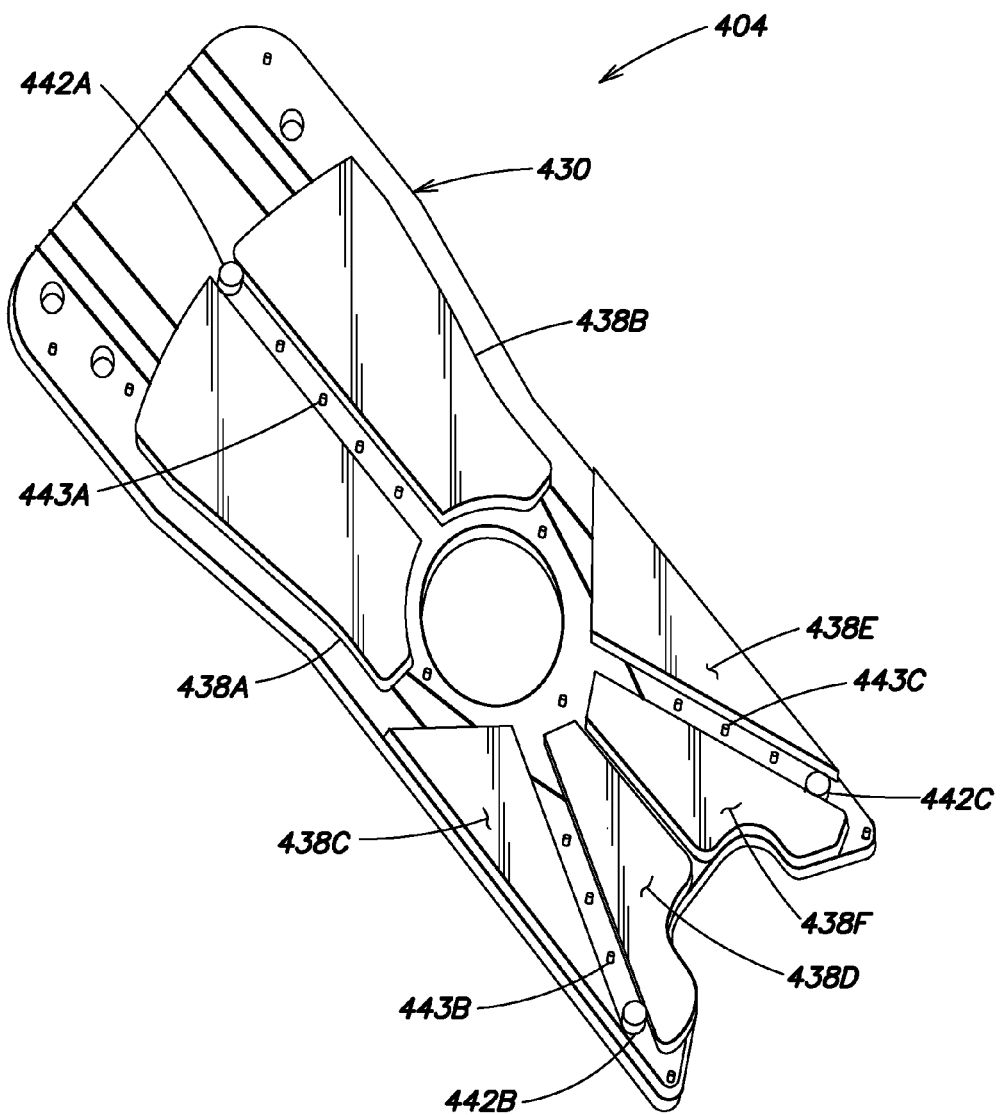
FIG. 4 is a perspective view of another embodiment of an electrostatic end effector apparatus according to the present invention.

Another embodiment of an electrostatic end effector 404 for transporting a substrate between system components in an electronic device manufacturing system is depicted in FIG. 4. Similar to the previous embodiment, this embodiment of an electrostatic end effector 404 includes a substantially planar insulating base 430 having a plurality of electrodes 438A, 438B mounted thereto, which may be conductive plates. In this embodiment, the base 430 may be made of dielectric (insulating) material, such as a ceramic. A dielectric material, such as alumina, having high resistivity (low conductivity) of between about $2.5 \times 10^6$ Ohm-cm and about $1 \times 10^{14}$ Ohm-cm may be used. The electrodes 438A, 438B may be made of a conductive material, such as aluminum, and may be made as thin plates. In contrast to the previous embodiment, this embodiment of electrostatic end effector 404 may include additional electrode pairs, namely electrode pairs 438C, 438D and pairs 438E, 438F, which may be of like construction as electrode pairs 438A, 438B. The electrodes 438A-

438F may include threaded holes (not shown) and be fastened to the base by screws (not shown) from the underside of base 430. The electrodes 438A-438F in this embodiment may be covered with a thin dielectric layer, such as a thin layer of alumina, which may also have a resistivity of between about $2.5 \times 10^6$ Ohm-cm and about $1 \times 10^{14}$ Ohm-cm and a thickness of about 10 microns to about 30 microns or more, for example. Similar to the previous embodiments, three contact pads 442A-442C may provide spacer members for spacing the substrate (not shown) from the various electrodes 438A-438F. In this embodiment, multiple sets of touchdown pads 443A-443C may be positioned at various points between the respective pairs of electrodes 438A-438F. Three or more touchdown pads may be provided for each electrode pair. Other numbers of touchdown pads may be provided.

Figure 5A:
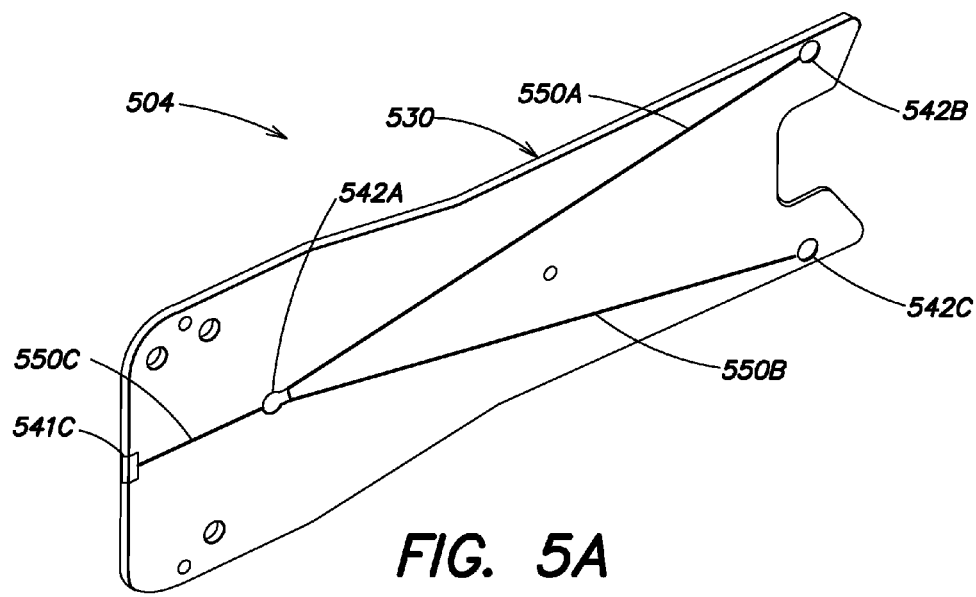
FIGS. 5A and 5B are perspective bottom and top views, respectively, of another embodiment of an electrostatic end effector apparatus according to the present invention.
Figure 5B:
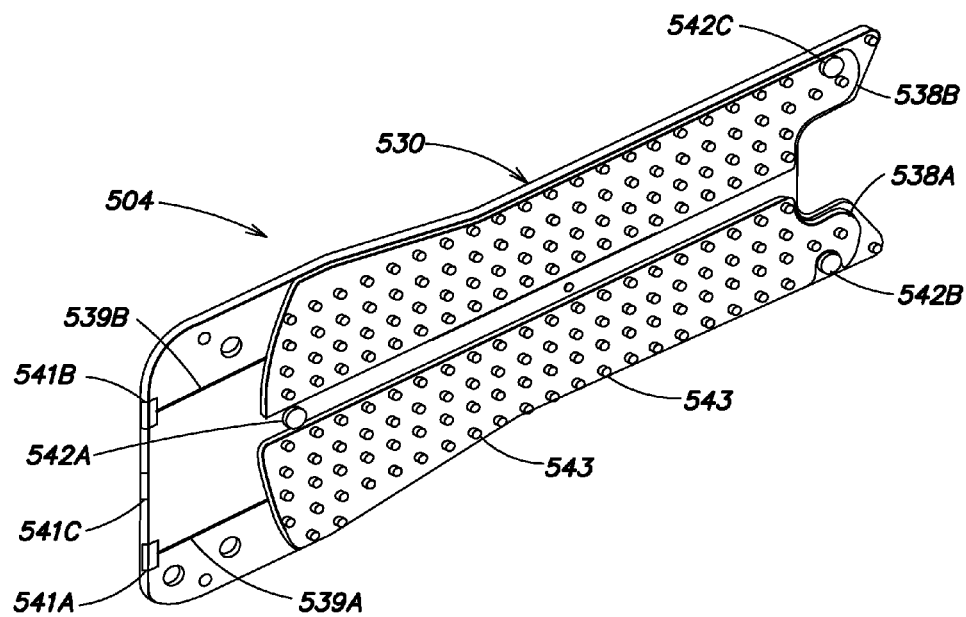

According to yet another embodiment of the invention, bottom and top perspective views, respectively, of an electrostatic end effector are shown in FIGS. 5A and 5B. This embodiment of electrostatic end effector 504 may include a nonconductive substantially planar base 530, which may be manufactured from alumina for example, planar film electrodes 538A, 538B, and spacer members comprising the contact pads 542A-542C. The electrodes may be a silver (Ag) film or a nickel plated silver (Ag) film as may be the conductors 539A, 539B and electrical contact patches 541A, 541B, which may be connected to a controllable voltage source (not shown). In this embodiment, the touchdown pads 543 may be formed in rows on the electrodes and may comprise any dielectric material such as alumina. The height of the touchdown pads 543 may be between about 0.002 inches (about 50 microns) and 0.010 inches (about 254 microns) above a surface of the electrodes 538A, 538B. Other than the dielectric material for the touchdown pads 543, the electrode surfaces may be substantially devoid of a dielectric (insulating) layer. The alumina touchdown pads 543 may number 25 or more, and even 50 or more on each electrode 538A, 538B. In this embodiment, the front contact pads 542B-542C may be at least partially surrounded by the electrode layer 538A, 538B.

Shown in FIG. 5A is an underside view of the end effector 504 depicting a portion of the switchable ground circuit previously described. The circuit portion may be provided in any location or orientation on an underside of the base 530. Electrically-conductive leads 550A and 550B may electrically connect to the underside of one or more of the pads 542A-542C. Electrically conductive lead 550C may further electrically connect to a conductive electrical contact patch 541C, which then may be connected to the remainder of a switchable ground circuit. The electrically-conductive leads 550A-550C and contact patch 541C may be any suitable conductor, such as a silver film or a nickel plated silver film, or simply a conducting wire.

Figure 6:
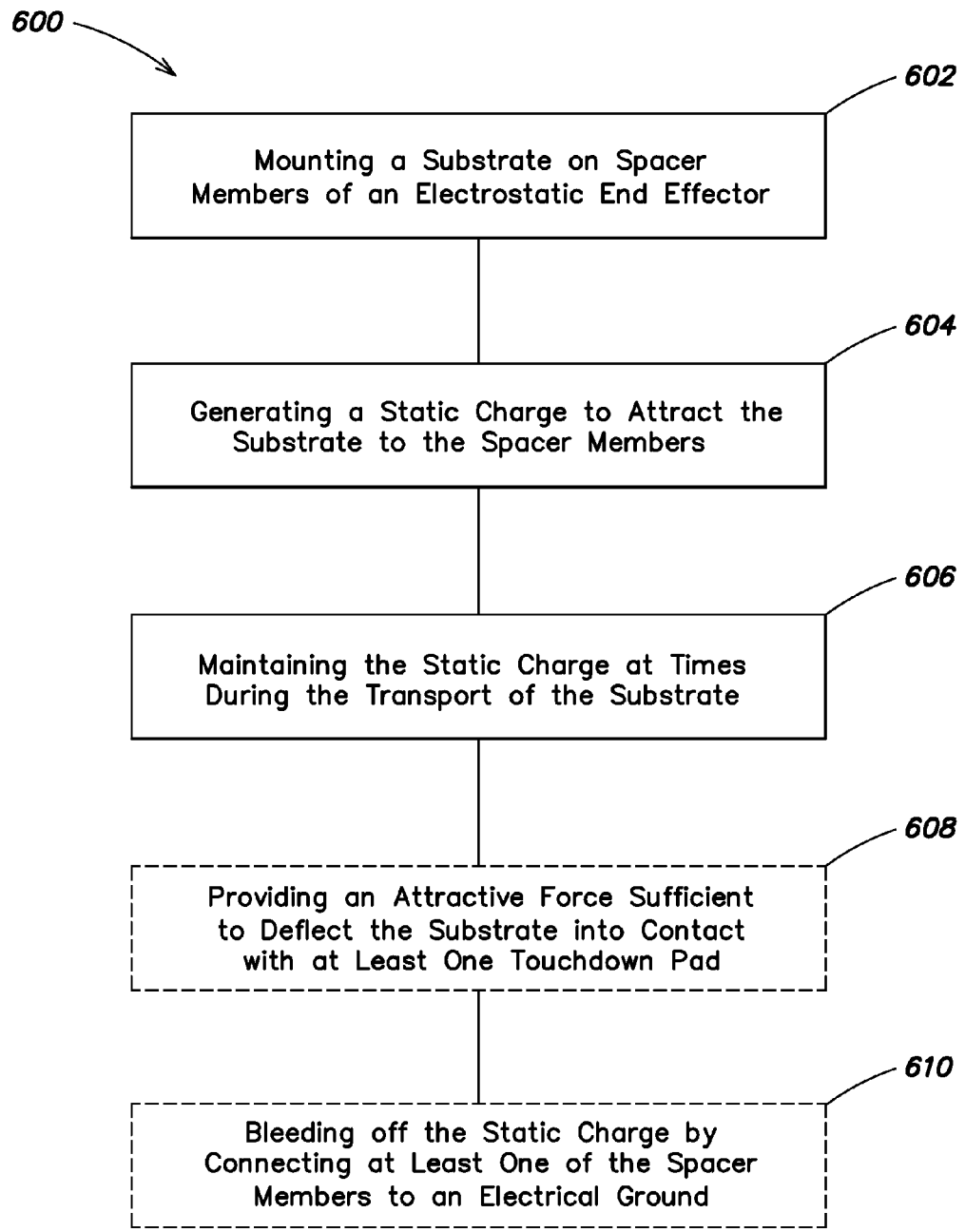
FIG. 6 is a flowchart illustrating a method according to embodiments of the present invention.

FIG. 6 illustrates a method of transporting a substrate between system components of an electronic device manufacturing system according to another aspect of the invention. The method 600 includes mounting the substrate on spacer members of an electrostatic end effector for transporting the substrate between the system components in 602. After the mounting and before (or substantially coincident with) the transport of the substrate, the electrodes of the electrostatic end effector may be electrified with a voltage potential of between about 500V-2,000V. Thus, 604 results in a static charge being formed in the substrate to attract the substrate to the spacer members and provide a gap between the substrate and the electrodes. The voltage continues to be applied during transport and maintains the charge at least at times during the transporting 606. The method 600 may optionally comprise in 608 providing an attractive force sufficient to deflect the substrate into contact with at least one touchdown pad at times during the transport. The deflection required such that the substrate will come to rest on at least one touchdown pad may be about 0.005 inches (127 microns) or more, for example. Following the transport of the substrate to another location, and de-electrifying the electrodes, the method 600 may optionally include bleeding off the static electrical charge by connecting at least one of the spacer members to an electrical ground in 610.

Various additional embodiments of the electrostatic end effectors are shown and described with reference to FIGS. 7-11. All embodiments include the common elements of a base, an electrode pair, and spacer members comprising three contact pads for contacting the substrate at three locations and providing a gap between the substrate (not shown) and the electrodes.

Figure 7:
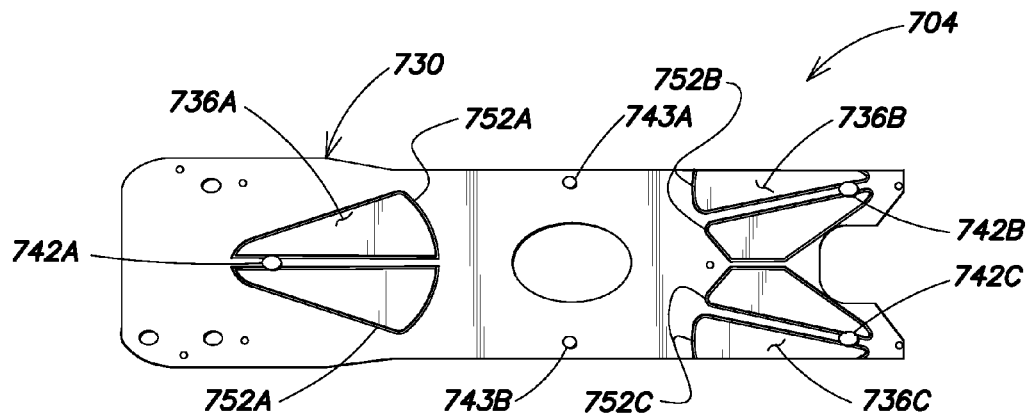
FIGS. 7-9 are top views of other embodiments of electrostatic end effector apparatus of the present invention.

In the embodiment of end effector 704 depicted in FIG. 7, the electrode pairs 736A-736C may be received in pockets or recesses 752A-752C formed into the base 730. The electrodes 736A-736C may include an insulating layer such as alumina on the exposed surface of the electrode which may be contacted by the substrate. The electrodes 736A-736C may be affixed to the base 730 and into the pockets 752A-752C by a press fit, mechanically fastened, or adhered by a suitable ceramic/epoxy adhesive, for example. As in the previous embodiments, the spacer members may include three contact pads 742A-742C to provide a three-point contact, and one or more touchdown pads 743A-743B may be provided.

Figure 8:
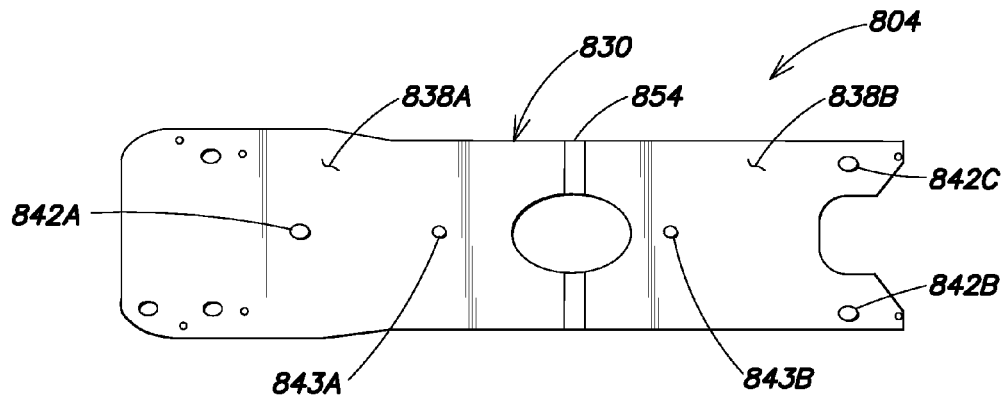

The electrodes 838A, 838B in the embodiment of electrostatic end effector 804 shown in FIG. 8 may be disposed in an end-to-end orientation as opposed to the side-to-side configurations shown in previous embodiments. The electrodes 838A, 838B may be attached to, and separated by, an insulator 854, such as alumina. The attachment of the electrodes 838A, 838B to the insulator 854 may be by brazing or the like. An entire upper surface of the brazed combination may then be coated with a thick layer of alumina by a plasma spray process, for example. In this embodiment, the thick layer of alumina may form the base 830. The surface of the thick layer may then be mechanically ground or machined to form the three contact pads 842A-842C and the one or more touchdown pads 843A, 843B. Electrical contact may be made on the underside of the electrostatic end effector 804 by any suitable means.

Figure 9:
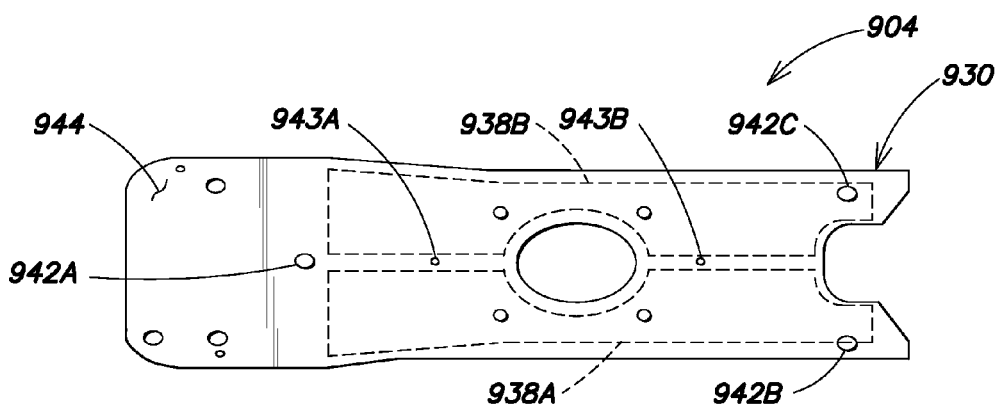

In the embodiment of electrostatic end effector 904 depicted in FIG. 9, the electrodes 938A, 938B (shown dotted) may be disposed within a laminated structure. Sandwiched on either side of the electrodes 938A, 938B may be dielectric layers 944 (only the top layer shown) comprised of alumina, for example. Other dielectric materials may be used. The spacer members comprising contact pads 942A-942C and touchdown pads 943A, 943B may be machined into the top dielectric layer such as by machining or grinding. The bottom and/or top layers 944 may comprise the base 930.

Figure 10:
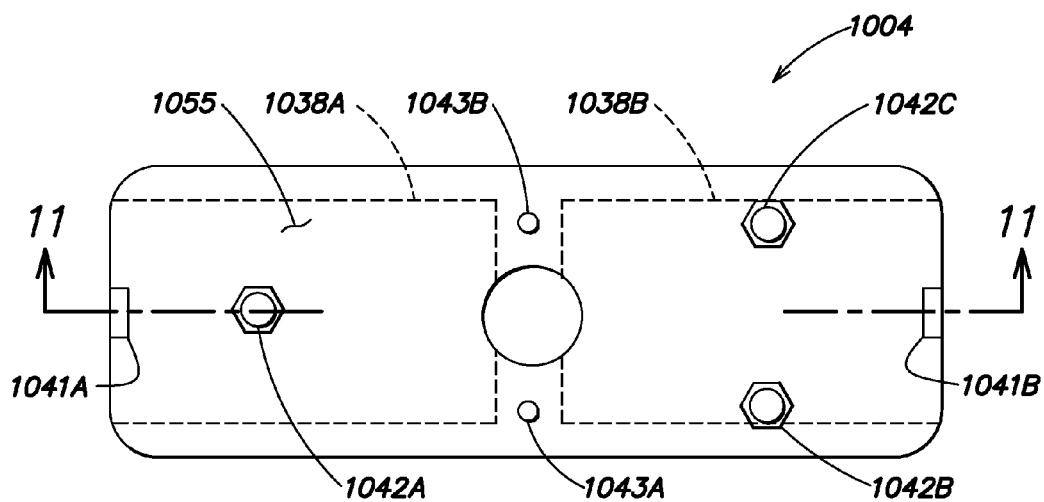
FIGS. 10-11 are top and cross-sectional side views, respectively, of another embodiment of electrostatic end effector apparatus of the present invention.
Figure 11:
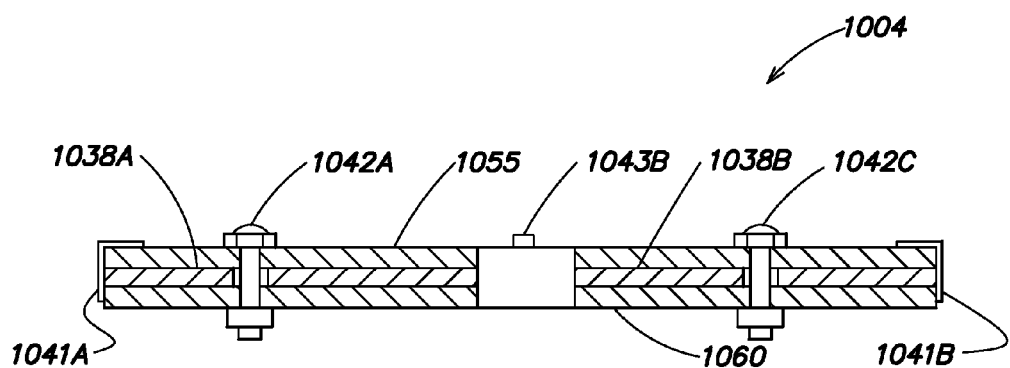

Another laminated embodiment of an electrostatic end effector apparatus 1004 is shown and described with reference to FIGS. 10 and 11. In the depicted embodiment, conductive plates comprising the electrodes 1038A, 1038B (shown dotted in FIG. 10) may be disposed in a horizontal end-to-end configuration. Planar members 1055, 1060 of a dielectric material (e.g., alumina) may be provided on either side of the electrodes 1038A, 1038B to form a laminated construction. Fasteners may secure the assembly together. The fasteners may comprise the conductive spacer members and have domed pads 1042A-1042C formed in the head or other portions thereof. One or more touchdown pads 1043A, 1043B may further be provided on the electrostatic end effector 1004. Electrical contact patches 1041A, 1041B may facilitate electrical connection to a variable voltage source (not shown).

The foregoing description discloses only exemplary embodiments of the invention. Modifications of the above-disclosed systems, apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention as defined by the following claims.

The invention claimed is:

1. A substrate transportation system for transporting a substrate between electronic device manufacturing system components, comprising:
   a robotic component; and
   an electrostatic end effector coupled to the robotic component, the end effector including a base, an electrode pair on the base, touchdown members and spacer members adapted to form a gap between the substrate and the electrode pair;
   wherein the touchdown members have a top surface offset from a plane formed by top surfaces of the electrode pair and are at a height less than a height of the spacer members;
   an electrostatic charge is adapted to operate to secure the substrate to the spacer members positioned on the base of the end effector at times during transport between the system components.

2. The substrate transportation system of claim 1 wherein the robotic component is comprised of a robot wrist.

3. The substrate transportation system of claim 1 wherein the system transports the substrate between a process chamber and a load lock.

4. The substrate transportation system of claim 1 wherein the system transports the substrate between a substrate carrier and a load lock.

5. The substrate transportation system of claim 1 comprising a switchable grounding circuit attached to at least one of the spacer members.

6. An electrostatic end effector apparatus for transporting a substrate between system components in an electronic device manufacturing system, comprising:
   a base adapted to be connected to a robotic component;
   an electrode pair positioned on the base; and
   spacer members positioned on the base and touchdown members located on one of the base, electrode pair or both, are adapted to provide a gap between the substrate and the electrode pair, wherein the touchdown members have a top surface offset from a plane formed by top surfaces of the electrode pair and are at a height less than a height of the spacer members.

7. The electrostatic end effector apparatus of claim 6 wherein the spacer members comprise at least three domed pads mounted on the base.

8. The electrostatic end effector apparatus of claim 6 wherein the end effector is adapted to produce a clamping force of at least 0.2 g.

9. The electrostatic end effector apparatus of claim 6 wherein the electrode pair are comprised of conductive plates mounted on the base.

10. The electrostatic end effector apparatus of claim 9 wherein the conductive plates are devoid of a dielectric layer formed on an upper surface thereof.

11. The electrostatic end effector apparatus of claim 6 further comprising multiple electrode pairs comprised of conductive plates mounted on the base.

12. The electrostatic end effector apparatus of claim 6 wherein at least one of the spacer members is electrically conductive.

13. The electrostatic end effector apparatus of claim 12 wherein the electrically-conductive spacer member is comprised of $Al_2O_3$ doped with a conductive material.

14. The electrostatic end effector apparatus of claim 12 further comprising an electrical lead of a ground circuit connected to the electrically-conductive spacer member.

15. The electrostatic end effector apparatus of claim 6 wherein the spacer members comprise three or more contact pads, at least one contact pad is electrically conductive and in communication with a switchable ground circuit, such that a residual static electrical charge from the substrate is neutralized upon a closing of the switchable ground circuit.

16. The electrostatic end effector apparatus of claim 6 wherein the touchdown members limit a bending motion of the substrate while the substrate is deflected under an influence of the electrostatic static charge, so as to prevent contact with the electrodes.

17. The electrostatic end effector apparatus of claim 6 wherein the spacer members consist essentially of three spaced pads.

18. The electrostatic end effector apparatus of claim 6 wherein the spacer members are adapted to form a three-point contact with the substrate where the gap between the substrate and the electrode pair is about 254 to 508 microns and up to 635 microns.

19. The electrostatic end effector apparatus of claim 6 wherein the base is comprised of a dielectric material.

20. The electrostatic end effector apparatus of claim 19 wherein the base is comprised of $Al_2O_3$.

21. The electrostatic end effector apparatus of claim 6 wherein each electrode of the electrode pair is comprised of a thin conductive layer having a thickness of less than about 254 microns.

22. The electrostatic end effector apparatus of claim 21 further comprising a dielectric layer disposed on a top surface of the thin conductive layer.

23. An electrostatic end effector apparatus for transporting a substrate between system components in an electronic device manufacturing system, comprising:
   a nonconductive alumina base adapted to be connected to a robotic component;
   a conductive electrode pair positioned on the base;
   spacer members consisting essentially of three domed, conductive contact pads positioned on the base and adapted to space the substrate from the electrode pair by a gap wherein at least one of the spacer members is electrically conductive; and
   a plurality of touchdown pads positioned on at least one of the base, the electrode pair, or both, wherein the plurality of touchdown pads include a top surface offset from a plane formed by top surfaces of the conductive electrode pair and are at a height less than a height of the spacer members.

24. A method of transporting a substrate between components of an electronic device manufacturing system, comprising the steps of:
   mounting a substrate on electrically conductive spacer members of an end effector;
   generating a static charge by applying a voltage to an electrode pair positioned on the end effector to attract the substrate to the spacer members whereby a gap is formed between the substrate and the electrode pair;

applying a attractive force via the voltage sufficient to deflect the substrate into contact with at least one touchdown pad, wherein the at least on touchdown pad includes a top surface offset from a plane formed by top surfaces of the conductive electrode pair and is at a height less than a height of the spacer members; and transporting the substrate between system components of the manufacturing system while maintaining the static charge at times during the transporting.

25. The method of claim 24 further comprising a step of ending the static charge, closing a switchable ground circuit in communication with the electrically conductive space members to neutralize a residual static electrical charge from the substrate.

* * * * *